United States Patent
Liu et al.

(10) Patent No.: US 10,157,920 B2
(45) Date of Patent: Dec. 18, 2018

(54) MULTI-FIN DEVICE AND METHOD OF MAKING SAME

(71) Applicant: Taiwan Semiconductor Manufacturing Company, Ltd., Hsinchu (TW)

(72) Inventors: Chi-Wen Liu, Hsinchu (TW); Chao-Hsiung Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/882,248

(22) Filed: Jan. 29, 2018

(65) Prior Publication Data

US 2018/0151566 A1 May 31, 2018

Related U.S. Application Data

(60) Continuation of application No. 15/096,100, filed on Apr. 11, 2016, now Pat. No. 9,893,061, which is a continuation of application No. 13/914,202, filed on Jun. 10, 2013, now Pat. No. 9,312,363, which is a (Continued)

(51) Int. Cl.

| *H01L 29/76* | (2006.01) |
|---|---|
| *H01L 29/94* | (2006.01) |
| *H01L 27/088* | (2006.01) |
| *H01L 21/8234* | (2006.01) |
| *H01L 29/66* | (2006.01) |
| *H01L 29/06* | (2006.01) |
| *H01L 29/20* | (2006.01) |
| *H01L 29/22* | (2006.01) |

(52) U.S. Cl.
CPC .. *H01L 27/0886* (2013.01); *H01L 21/823431* (2013.01); *H01L 29/0649* (2013.01); *H01L 29/0657* (2013.01); *H01L 29/20* (2013.01); *H01L 29/22* (2013.01); *H01L 29/66795* (2013.01)

(58) Field of Classification Search
CPC ........... H01L 29/66795; H01L 29/7851; H01L 29/785; H01L 21/823431; H01L 29/41791
See application file for complete search history.

(56) References Cited

U.S. PATENT DOCUMENTS

| 6,376,876 B1 | 4/2002 | Shin et al. |
|---|---|---|
| 6,642,090 B1 | 11/2003 | Fried et al. |
| 6,703,661 B2 | 3/2004 | Wu |

(Continued)

FOREIGN PATENT DOCUMENTS

KR 20050083305 8/2005

*Primary Examiner* — Bradley K Smith
*Assistant Examiner* — David Goodwin
(74) *Attorney, Agent, or Firm* — Slater Matsil, LLP

(57) ABSTRACT

A multiple-fin device includes a substrate and a plurality of fins formed on the substrate. Source and drain regions are formed in the respective fins. A dielectric layer is formed on the substrate. The dielectric layer has a first thickness adjacent one side of a first fin and having a second thickness, different from the first thickness, adjacent an opposite side of the fin. A continuous gate structure is formed overlying the plurality of fins, the continuous gate structure being adjacent a top surface of each fin and at least one sidewall surface of at least one fin. By adjusting the dielectric layer thickness, channel width of the resulting device can be fine-tuned.

20 Claims, 8 Drawing Sheets

Related U.S. Application Data division of application No. 13/223,682, filed on Sep. 1, 2011, now Pat. No. 9,287,385.

(56) References Cited

U.S. PATENT DOCUMENTS

| | | | |
|---|---|---|---|
| 6,757,854 B1 | 6/2004 | Zhao et al. | |
| 6,787,854 B1 | 9/2004 | Yang et al. | |
| 7,279,375 B2 | 10/2007 | Radosavljevic et al. | |
| 7,358,142 B2 * | 4/2008 | Kang | H01L 29/66795 |
| | | | 257/E21.442 |
| 7,381,649 B2 * | 6/2008 | Chen | H01L 21/823412 |
| | | | 257/E21.618 |
| 7,449,373 B2 * | 11/2008 | Doyle | H01L 21/26586 |
| | | | 257/E21.345 |
| 7,479,421 B2 | 1/2009 | Kavalieros et al. | |
| 7,560,785 B2 * | 7/2009 | Yu | H01L 29/66795 |
| | | | 257/330 |
| 7,564,105 B2 | 7/2009 | Chi et al. | |
| 7,575,975 B2 | 8/2009 | Thean et al. | |
| 7,622,373 B2 | 11/2009 | Zheng et al. | |
| 7,622,765 B2 | 11/2009 | Kim et al. | |
| 7,843,000 B2 | 11/2010 | Yu et al. | |
| 7,871,875 B2 | 1/2011 | Kim et al. | |
| 8,022,478 B2 | 9/2011 | Anderson et al. | |
| 8,098,529 B2 | 1/2012 | Goda | |
| 8,106,459 B2 * | 1/2012 | Chang | H01L 21/823412 |
| | | | 257/328 |
| 8,174,073 B2 | 5/2012 | Lee et al. | |
| 8,193,567 B2 | 6/2012 | Kavalieros et al. | |
| 8,405,164 B2 | 3/2013 | Hareland et al. | |
| 8,519,481 B2 | 8/2013 | Yuan et al. | |
| 9,287,385 B2 | 3/2016 | Liu et al. | |
| 2005/0215014 A1 | 9/2005 | Ahn et al. | |
| 2005/0224800 A1 | 10/2005 | Lindert et al. | |
| 2007/0001219 A1 | 1/2007 | Radosavljevic et al. | |
| 2007/0048934 A1 | 3/2007 | Kim et al. | |
| 2007/0238273 A1 | 10/2007 | Doyle et al. | |
| 2007/0284632 A1 * | 12/2007 | Kim | H01L 27/115 |
| | | | 257/288 |
| 2009/0057761 A1 | 3/2009 | Kim et al. | |
| 2009/0090976 A1 * | 4/2009 | Kavalieros | H01L 21/823431 |
| | | | 257/369 |
| 2009/0209074 A1 * | 8/2009 | Anderson | H01L 29/66795 |
| | | | 438/283 |
| 2009/0250769 A1 | 10/2009 | Yu et al. | |
| 2011/0037129 A1 | 2/2011 | Yu et al. | |
| 2011/0095378 A1 | 4/2011 | Lee et al. | |
| 2011/0147848 A1 | 6/2011 | Kuhn et al. | |

* cited by examiner

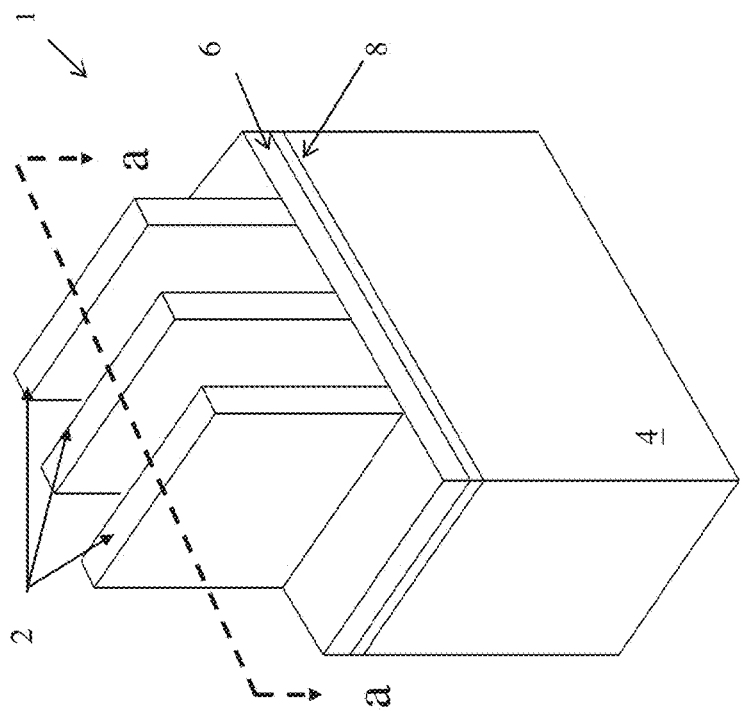
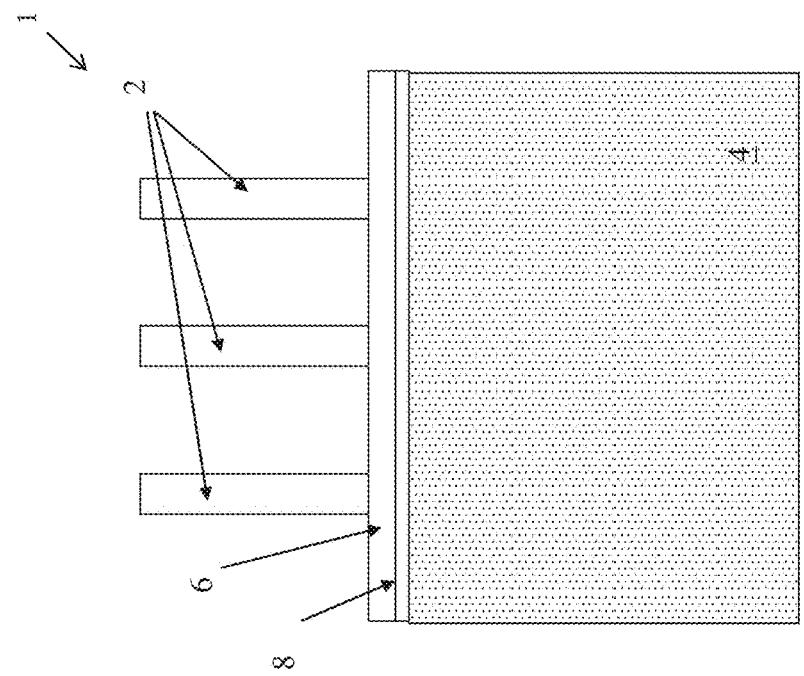

MULTI-FIN DEVICE AND METHOD OF MAKING SAME

PRIORITY CLAIM AND CROSS-REFERENCE

This application is a continuation of U.S. patent application Ser. No. 15/096,100, filed on Apr. 11, 2016, entitled "Multi-Fin Device and Method of Making Same," which is a continuation of U.S. patent application Ser. No. 13/914,202, filed on Jun. 10, 2013, now U.S. Pat. No. 9,312,363 issued on Apr. 12, 2016, and entitled "Multi-Fin Device and Method of Making Same," which claims priority to and is a divisional application of U.S. patent application Ser. No. 13/223,682, filed on Sep. 1, 2011, now U.S. Pat. No. 9,287,385 issued on Mar. 15, 2016, and entitled "Multi-Fin Device and Method of Making Same," which applications are hereby incorporated herein by reference.

BACKGROUND

The so-called Fin field effect transistor (FinFET) device is becoming increasingly popular for high performance, low dimension integrated circuits. Because the gate wraps around the channel region on three sides, FinFETs provide excellent channel control with small critical dimensions. On the other hand, the very nature of the FinFET structure makes it difficult to adjust or tune the channel width of a typical FinFET device. Since various device performance parameters, such as driving current (IDsat) are related to channel width, it is disadvantageous that channel width cannot be readily tuned or adjusted. What is needed then, is a FinFET structure and methods of making same that overcome the shortcomings in the conventional arts.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1a-6b illustrate various stages in the manufacture of an embodiment 1;

DETAILED DESCRIPTION

Figure 2A:
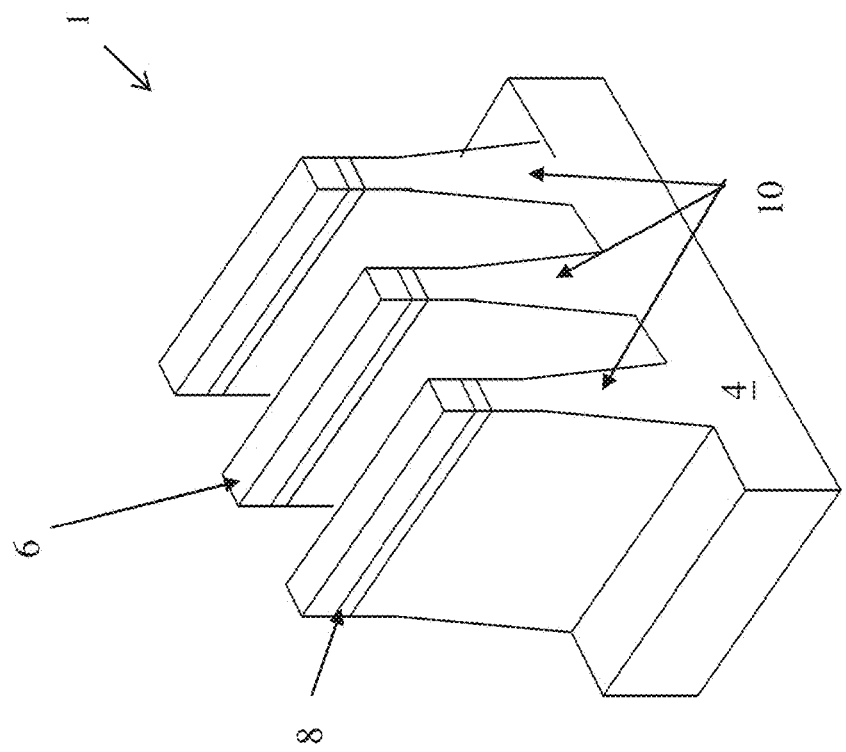

FIG. 1a illustrates, in perspective view, an intermediate stage in the manufacture of a Fin field effect transistor (FinFET) device 1. FIG. 1b illustrates the structure in cross-sectional view along the line indicated as a-a in FIG. 1a. In the illustrated embodiments, FinFET 1 will extend across several fins, and more specifically three fins, as will be explained in greater detail below. In the intermediate stage of manufacture illustrated in FIG. 1a, a patterned photo-sensitive layer 2 has been formed on a substrate 4. More precisely, patterned photo-sensitive layer 4, such as a photoresist or the like, is formed atop hard mask 6, which in turn is atop pad oxide 8, which in turn is atop substrate 4. Hard mask 6 may be silicon nitride, silicon oxynitride, or the like. Pad oxide layer 8 may be silicon oxide and their formations are well known.

Substrate 4 may be a bulk substrate such as a bulk silicon wafer. Alternatively, substrate 4 may be simply a top semiconductor layer of a compound wafer, such as a silicon-on-insulator substrate. In yet other embodiments, substrate 4 may be either a bulk substrate or a top layer of a compound wafer comprising Ge, SiGe, a III-V material such as GaAs, InAs, a II-VI material such as ZeSe, ZnS, and the like, typically epitaxially grown. It is believed the III-V or II-VI materials may be particularly advantageous for forming illustrative devices because of the beneficial strain properties that can be derived from using III-V or II-VI properties, such as InAs, ZnS, and the like.

Figure 2B:
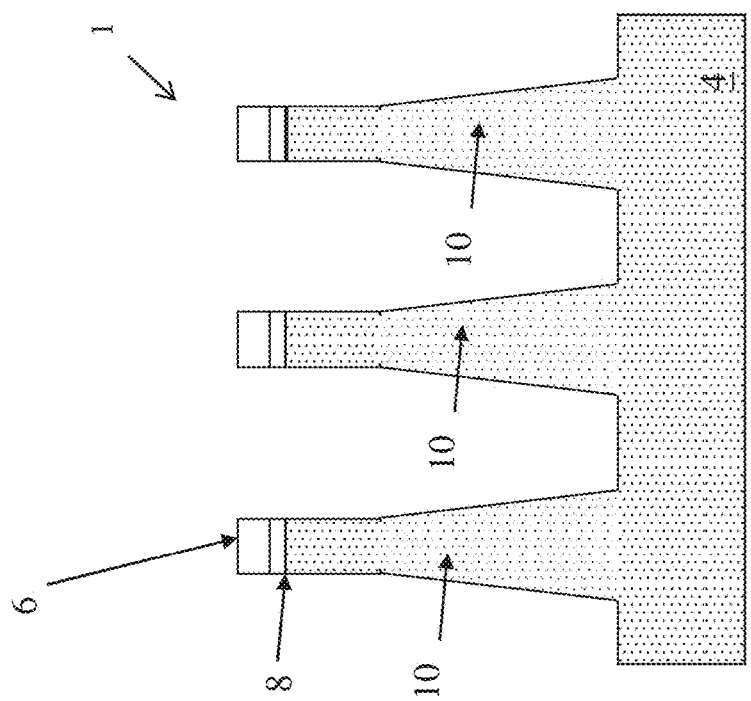

As illustrated in FIGS. 2a and 2b (wherein FIG. 2a continues the perspective view and FIG. 2b continues the cross-sectional view of FIGS. 1a and 1b, respectively), the pattern of patterned photo-sensitive layer 4 is transferred into hard mask 6, pad oxide 8, and substrate 4 using well known etching processes the details of which are not necessary for understanding the invention and hence are not repeated herein. During this pattern transfer process, patterned photo-sensitive layer 2 may be entirely consumed as indicated by FIGS. 2a and 2b. In some embodiments, patterned photo-sensitive layer 2 is not entirely consumed, but rather remaining portions of patterned photo-sensitive layer 2 are removed using, e.g., an oxygen plasma or so-called ash process. The resulting structure includes a plurality of fins 10 formed in substrate 4. Each fin of the plurality of fins 10 has a sidewall, a portion of the sidewall being substantially orthogonal to a major surface of the substrate 4, and a lower portion of the sidewall being non-orthogonal to the major surface of the substrate. These fins 10 serve as the fin structure for the to-be-formed FinFET device 1. In some embodiments substrate 4 is etched to a depth, meaning fins 10 are formed to a height, of from about 40 nm to about 80 nm. In one specific embodiment, fins 10 are formed to a height of about 60 nm.

Figure 3A:
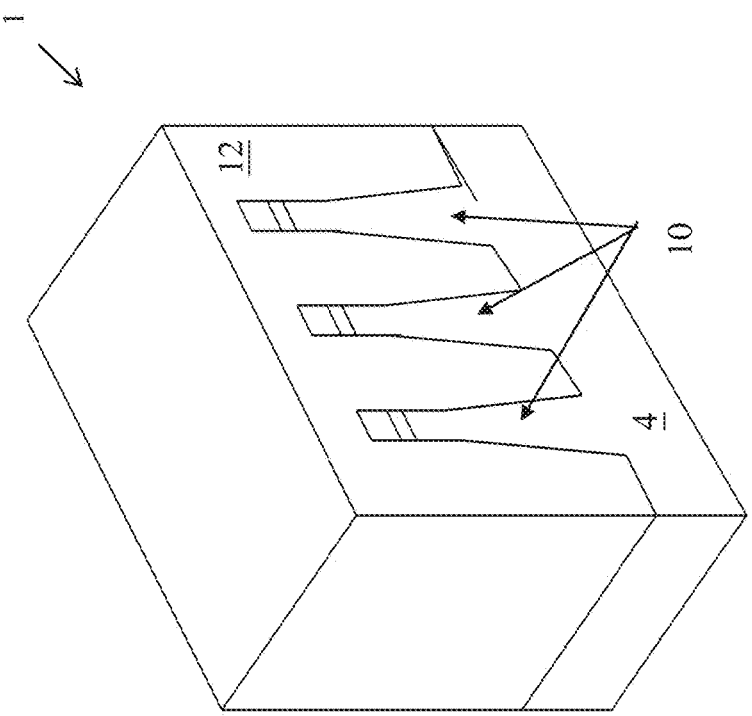
Figure 3B:
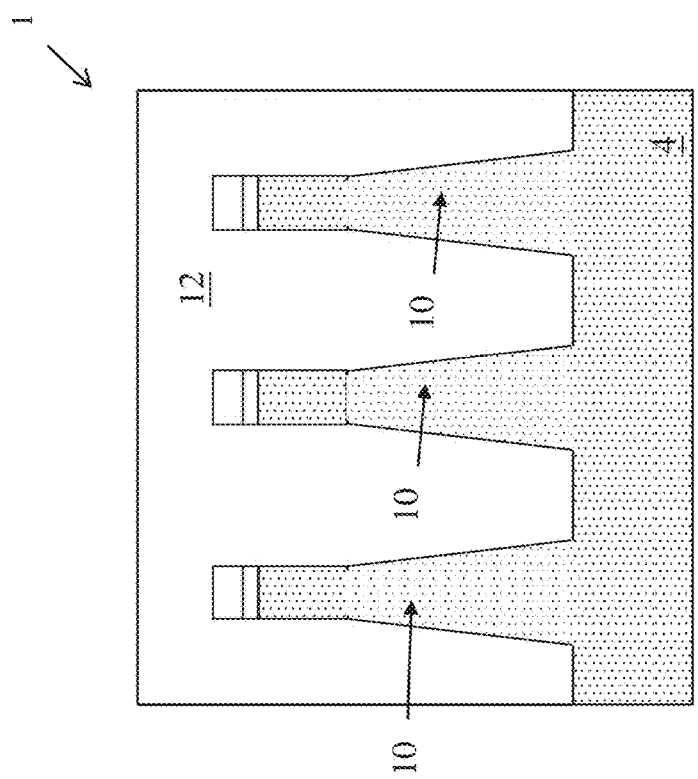

Turning now to FIG. 3, an oxide layer 12 is blanket deposited on device 1. Oxide layer 12, sometimes referred to as shallow trench isolation oxide or just shallow trench isolation, may be deposited by, e.g., a chemical vapor deposition (CVD) process, by a spin-on-glass process, or the like using process steps that are known to those skilled in the art. Optionally and prior to forming oxide 12, a thermal oxidation of fins 10 may be undertaken to repair damage that occurred to the sidewalls during the etching step (illustrated in FIGS. 2a and 2b).

Figure 4A:
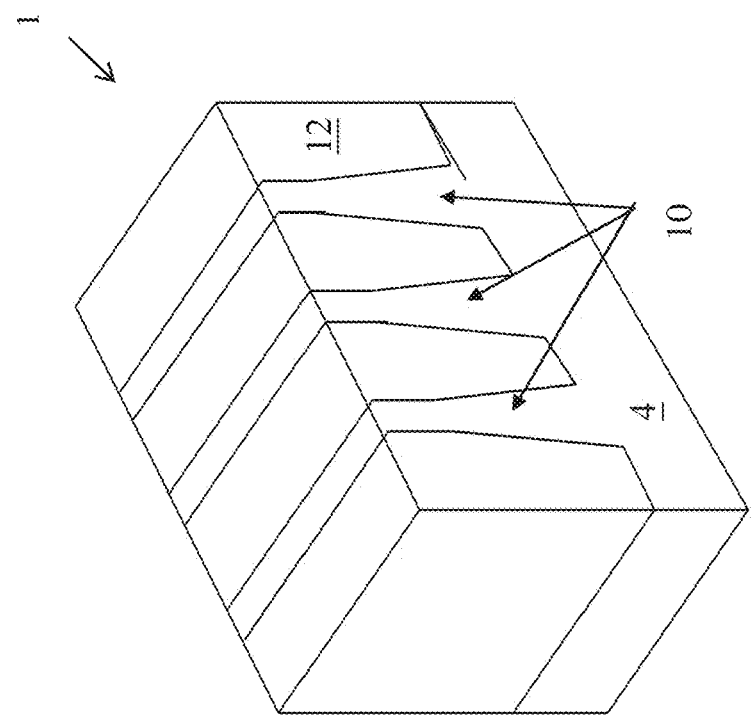
Figure 4B:
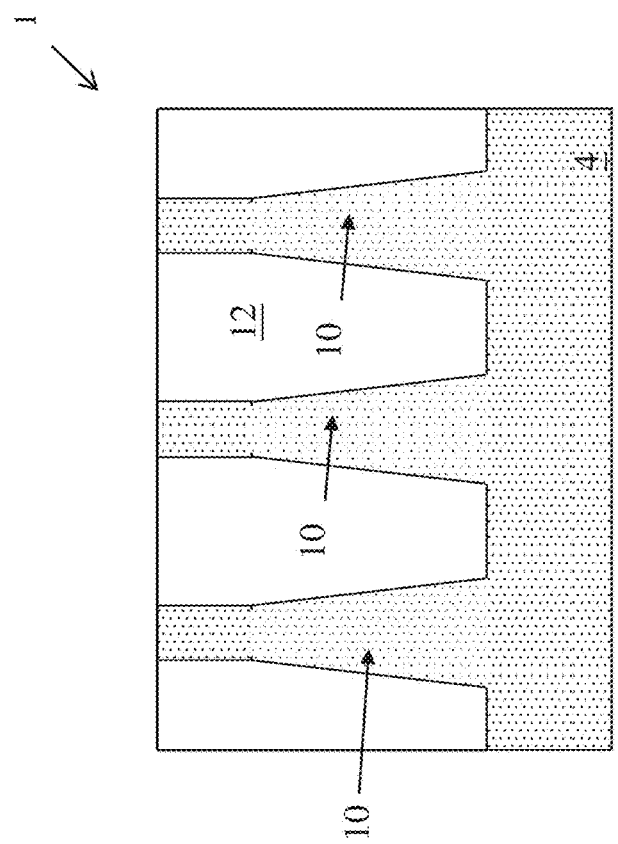

A CMP step is employed to thin oxide layer 12 back to the level of the tops of fins 10, as illustrated in FIGS. 4a and 4b. Note that patterned hard mask 6 and patterned pad oxide 8 are removed in the CMP step. The process parameters for a CMP step are well known in the art and hence are not repeated herein for the sake of brevity and clarity. In some embodiments, after the CMP process, the step of forming a plurality of fins 10 on a substrate 4 may further comprise a process selected from the group consisting essentially of etching fins into a substrate and epitaxially growing fins on a substrate, and combinations thereof. Thus, the plurality of fins may be selected from the group consisting essentially of an epitaxial material, the substrate material, and combinations thereof.

Figure 5A:
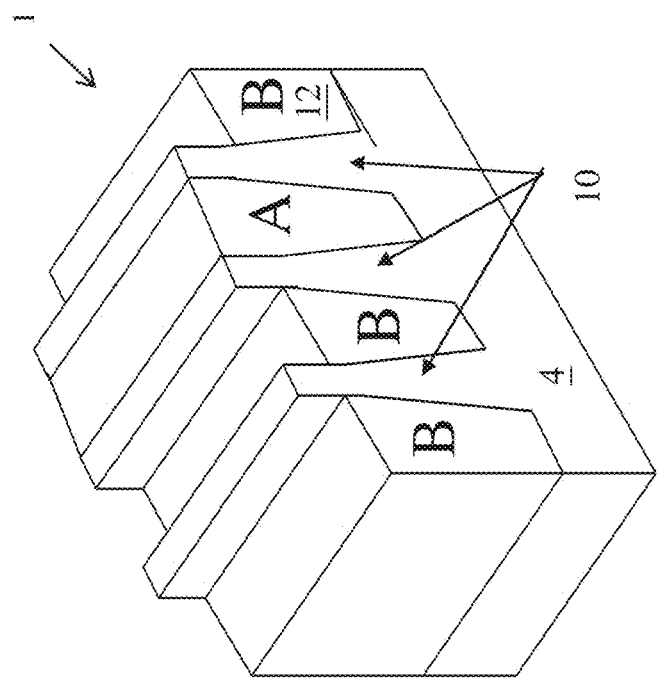

FIG. 5a illustrates the next stage in the manufacturing process, wherein oxide layer 12 is further thinned back. Oxide layer 12 can be thinned back in a variety of ways. In one embodiment, oxide layer 12 is thinned back by a diluted hydrofluoric acid (DHF) treatment or a vapor hydrofluoric acid (VHF) treatment for a suitable time. Note in particular that oxide layer 12 is selectively thinned back, as illustrated by the notations A (indicating portions of oxide layer 12 that have not been thinned back) and B (indicating portions of oxide layer 12 that have been thinned back). This selective thinning can be accomplished by covering portion A of oxide layer 12 with a protective layer, such as a photoresist layer, during the etch back process.

Figure 5B:
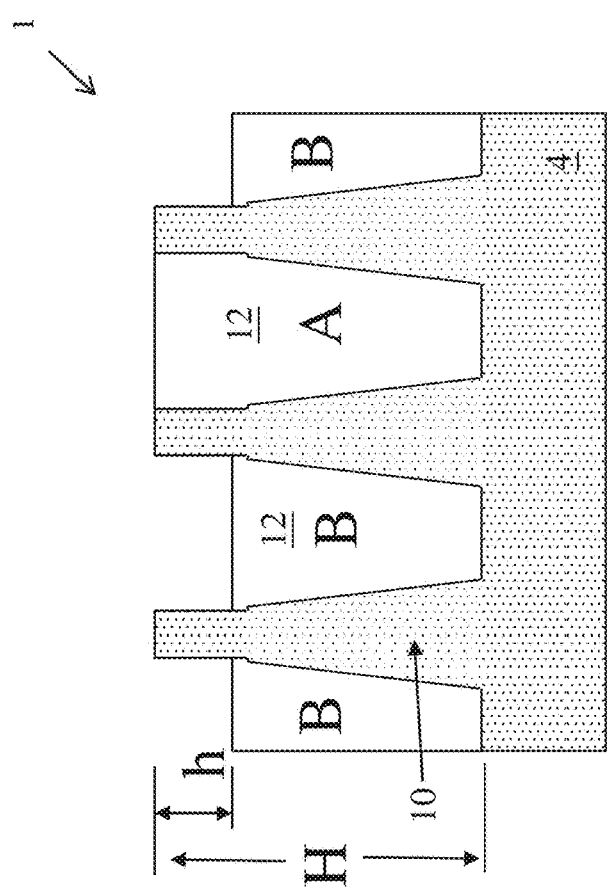

In the embodiment illustrated in FIG. 5b, fin 10 extends a distance H above the surface of substrate 4 and extends a distance h above the thinned back portions B of oxide layer 12. In illustrative embodiments, $\frac{1}{4} < h/H < \frac{1}{3}$ for the B regions. It is believed that this ratio of the extension of fins 10 above oxide layer 12 in the B regions provides for a desirable channel width, as will be explained further below.

Figure 6A:
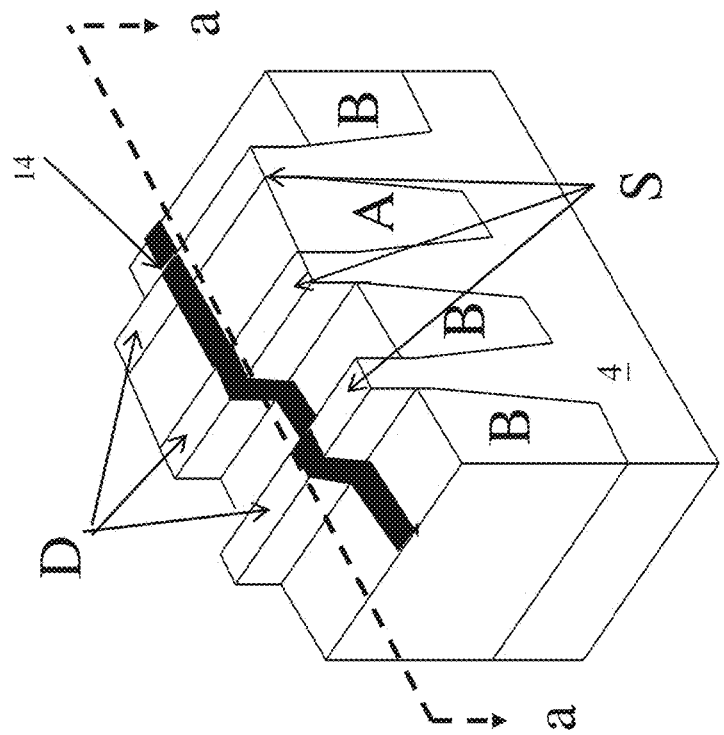
Figure 6B:
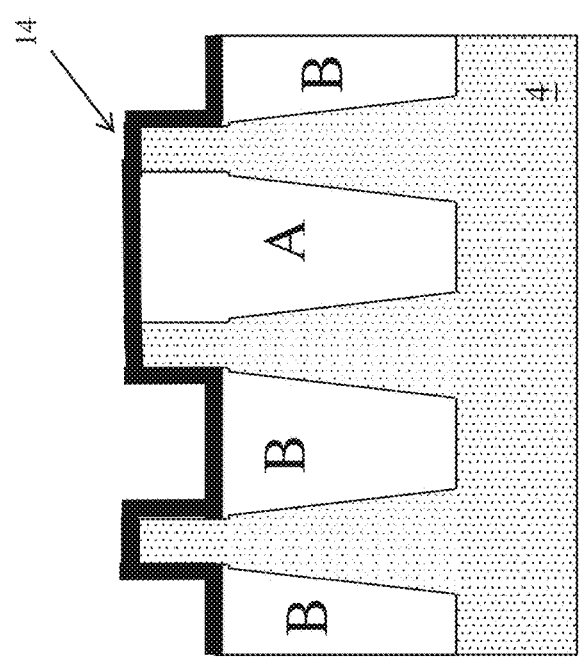

Next, a single continuous gate structure is formed over the three fins 10, as illustrated in FIGS. 6a and 6b. Also illustrated in FIG. 6b is the formation of source regions S and drain regions D within respective fins 10. In one embodiment, forming source and drain regions includes implanting dopants into the respective fins. In another embodiment, forming source and drain regions comprises etching fins into a substrate and epitaxially growing source and drain regions on a substrate. One skilled in the art will recognize the multiple process steps for forming gate structure 14, which includes formation and patterning of a gate dielectric and formation and patterning of a gate electrode. Such details are not necessary for an understanding of the present invention and the gate dielectric and electrode are referred to collectively herein as the gate structure 14. Likewise, the details of forming doped source and drain regions are known and are the details are not repeated herein for the sake of clarity. In this instance, a first metal layer may be continuous and overlying the three source regions to form source region of one finFET device. Further, a second metal layer may be continuous and overlying the three drain regions to form drain region of one finFET device.

Those of skill in the art will recognize that channel length and channel width are two significant parameters for a transistor, including for a finFET device such as illustrative device 1. Channel length is substantially equal to the distance between the source S and drain D regions. In the illustrated embodiment, the use of multiple fins and particularly multiple fins having varying heights as a result of the varying thickness of oxide layer 12 between the fins, has no impact on channel length. In other words, the different oxide layer 12 thicknesses between the fins does not impact the distance between the source S and drain D, or the channel length. Channel length impacts such transistor performance as, e.g., switching speed.

Channel width also impacts device performance, such as the driving current of the device. As an example, $I_{DSAT}$ can be fine-tuned by adjusting the channel width. By varying the thickness of oxide layer 12 between fins, and hence varying the height of fins 10 above the oxide layer, the overall channel width of the resulting finFET can be modified. This is explained in greater detail with regard to FIGS. 6c through 6f.

Figure 6C:
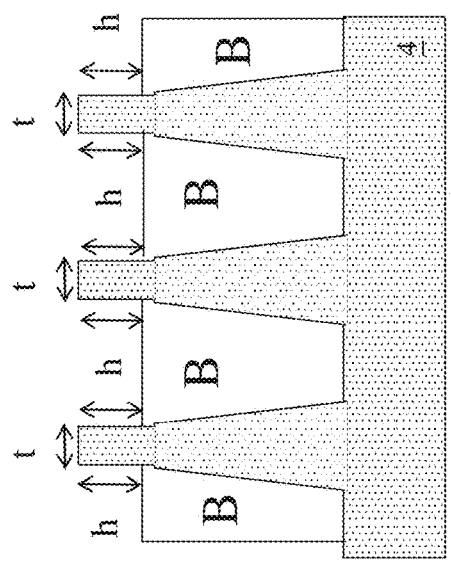
FIGS. 6c-6f illustrate alternative approaches to adjusting dielectric layer thickness in an embodiment.
Figure 6D:
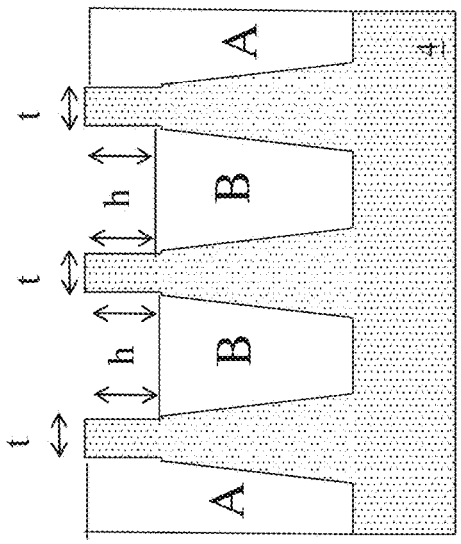

Referring first to FIG. 6c, an end-point embodiment is illustrated in which oxide layer 12 is not etched back at all between fins 10. In this embodiment, the total channel width (after gate structure 14 is formed) will be equal to the thickness t of the fins 10. In this instance, with three fins 10 ganged together to form one finFET device (i.e. with a single gate structure 14 continuous and overlying the three fins 10 such as illustrated in FIG. 6b), the total channel width would be equal to 3 t. This structure is effectively equivalent to a planar transistor device. By contrast, FIG. 6d illustrates the other end-point embodiment, in which oxide layer 12 is uniformly etched back between all fins 10. In this embodiment, the total channel width will be equal to the thickness t of each fin plus 2 times the height h of each fin (because the gate structure will overlie both sidewalls of each fin, each having a height h and the top of each fin, having a thickness t). In the illustrated embodiment, the channel width would be equal to 3 t+6 h. While such a structure might be beneficial in that it is easy to lay out a three fin structure, e.g., in an equivalent area to a planar transistor of similar characteristics, the multiple fin structure might have excessive drive current which can negatively impact desired performance.

Figure 6E:
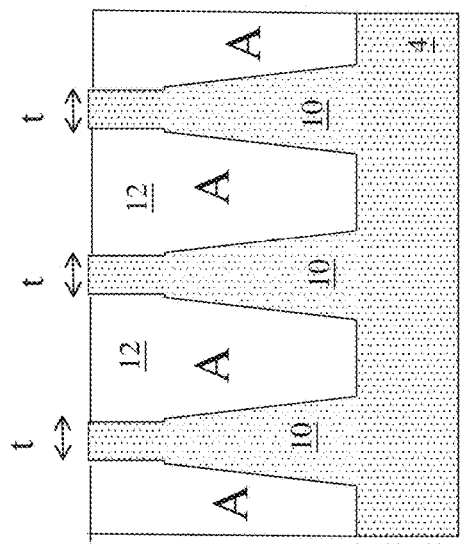

FIG. 6e illustrates another embodiment structure wherein drive current is modified by having oxide layer 12 of varying thickness between the fins. Note that in the embodiment of FIG. 6e, oxide layer 12 is etched back between one pair of fins 10 (the leftmost and center fin), but is not etched back between the other pair of fins 10 (the rightmost and center fin), for example. In this case, the drive current of the resulting structure will be 3 t+2 h, as only two sidewalls of the fins are exposed for gate structure 14 (not shown, but illustrated in FIG. 6b) to overlie.

Figure 6F:
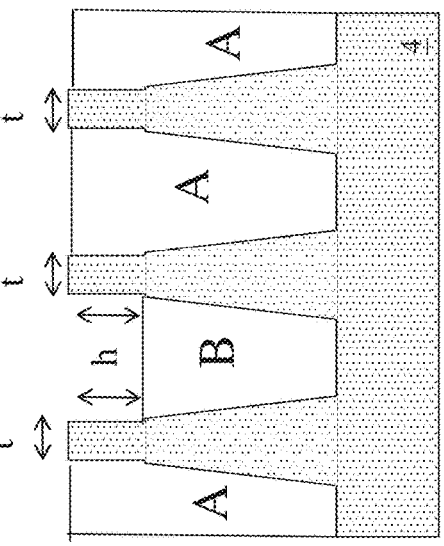

FIG. 6f illustrates yet another embodiment, wherein gate oxide 12 is etched back between both pairs of fins, but not on the outer edges of the outside fins. In this illustrated example, the total channel width is equal to 3 t+4 h. One skilled in the art will recognize various other configurations that can be employed to fine tune the channel width by adjusting the oxide layer 12 thickness bordering the various fins 10.

Figure 7A:
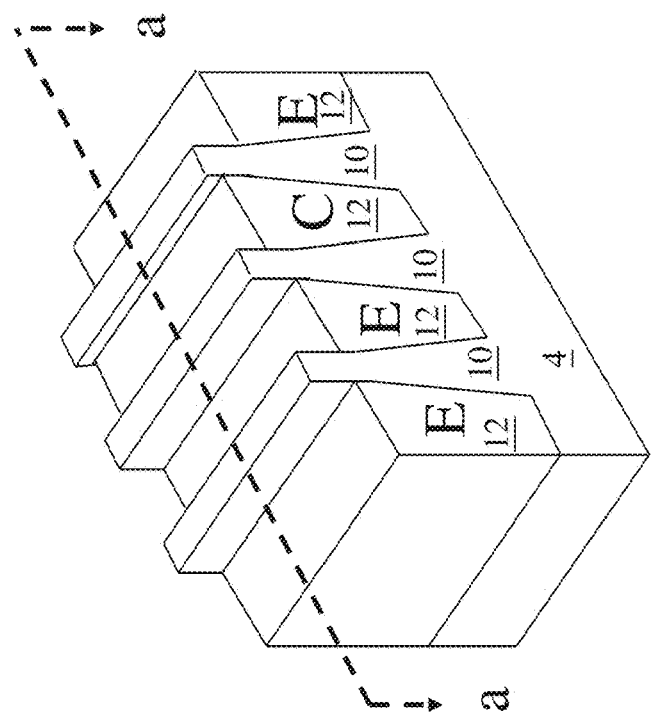
FIGS. 7a-7b illustrate an alternative embodiment of the structure illustrated in FIGS. 6a and 6b, respectively.
Figure 7B:
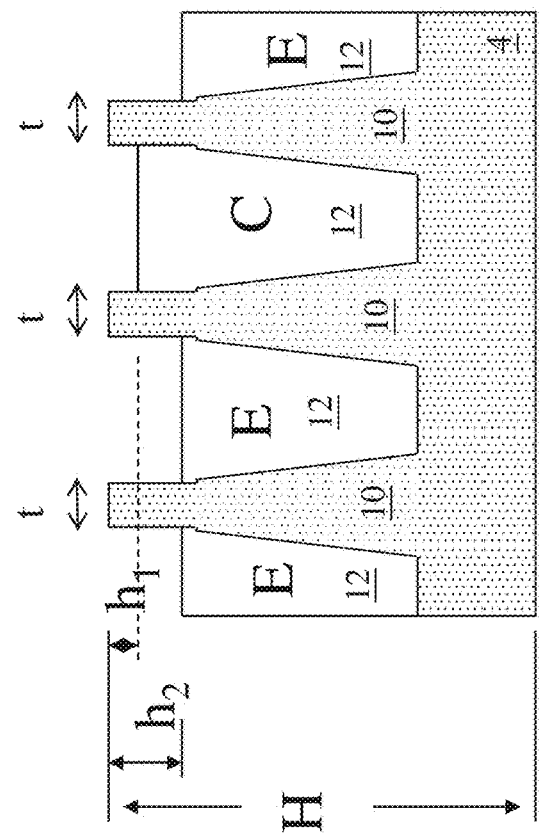

In the embodiments illustrated in FIG. 6 (which includes FIGS. 6a through 6f), oxide layer 12 is either etched is some regions (regions B) or remains totally un-etched in other regions (regions A). In other embodiments, further fine tuning can be obtained by etching back certain regions of oxide layer 12 by a first amount and etching back other regions of oxide layer 12 by a second greater amount. FIGS. 7a and 7b illustrate one such embodiment.

FIG. 7a illustrates in perspective view and FIG. 7b illustrates in cross sectional view an embodiment in which the portions of oxide layer 12 denoted as C as protected (e.g., covered with a photoresists, a hard mask, a sacrificial layer, or the like) during a first etch back step in which portions of oxide layer 12 denoted as E are partially etched back. In a next process step, portions C are exposed and oxide layer 12, including portions C and E, is further etched back to the levels shown in FIGS. 7a and 7b. In this case, the left most fin 10 extends a height of $h_2$ above oxide layer 12 whereas the two rightmost fins extend a height $h_2$ above oxide layer 12 on their respective outer sidewalls (because oxide layer 12 is at a thickness of "E" on the outer regions of the fins) and extend a lesser height of $h_1$ above oxide layer 12, having a thickness of "C" along their respective inner sidewalls. Assuming fins 10 have a thickness of t, the total channel width for the embodiment illustrated in FIG. 7 is 3 t+4 $h_2$+2 $h_1$.

Although the present embodiments and their advantages have been described in detail, it should be understood that various changes, substitutions, and alterations can be made herein without departing from the spirit and scope of the disclosure as defined by the appended claims. As but a few examples, although a finFET device extending across three fins is shown, the teachings of the present disclosure would apply equally to a finFET extending across two fins, or extending across four or more finds. Likewise, other multi-gate devices, such as w-gate devices, omega-gate devices, and the like are within the contemplated scope. Additionally, even further fine tuning of channel length can be obtained by extending the above described two etch back process (FIG. 7) to a three etch back process wherein oxide layer 12 could be three different heights, resulting in fins with up to three different sidewall fin heights. This teaching could be further extending to four or more different oxide layer thicknesses by adding additional etch back and masking steps. It is important to note that the present teaching would apply equally to fins that are epitaxially grown as it does to fins that are etched into a substrate.

One general aspect described herein includes a device including: a substrate; a plurality of fins formed on the substrate, each fin of the plurality of fins having opposed sidewalls, upper portion of the opposed sidewall being substantially parallel to one another, and lower portions of the opposed sidewalls being non-parallel to one another; source and drain regions formed in each fin of the plurality of fins; a dielectric layer formed on the substrate, the dielectric layer having a first region having a first thickness, the first region having a top surface extending to a top surface of a first fin of the plurality of fins, the first region adjacent one side of the first fin and the dielectric layer further having a second region having a second thickness, different from the first thickness, adjacent an opposite side of the first fin, the second region having a top surface below the top surface of the first region; a continuous gate structure overlying the plurality of fins, the continuous gate structure being adjacent a top surface of each fin, including the top surface of the first fin, and at least one sidewall surface of at least one fin; and a first continuous conductor overlying the source regions of each of the plurality of fins and forming a single source region of a single transistor that includes the plurality of fins.

Another general aspect described herein includes a transistor including: a dielectric layer having a first portion, a second portion and a third portion; a first semiconductor fin in the dielectric layer, the first semiconductor fin having a first sidewall and further having a second sidewall adjacent to, and extending a first distance over, the first portion of the dielectric layer; a second semiconductor fin in the dielectric layer between the first portion and second portion of the dielectric layer, the second semiconductor fin extending the first distance above the first and second portions of the dielectric layer; a third semiconductor fin in the dielectric layer between the second portion and third portion of the dielectric layer, the third semiconductor fin having a first sidewall disposed at, and extending the first distance above, the second portion of the dielectric layer, and further having a top surface, and a second sidewall disposed at the third portion of the dielectric layer, the third portion of the dielectric layer having a top surface coplanar with the top surface of the third semiconductor fin; a source region distributed in the first, second and third semiconductor fins a drain region distributed in the first, second and third semiconductor fins; a channel region defined between the source region and the drain region and extending within the first, second and third fins; and a single, continuous gate structure configured to the channel region.

Yet another general aspect described herein includes a device including: a substrate having a plurality of fins, each fin of the plurality of fins having a substantially equal height and each fin having a top surface a first sidewall and a second sidewall opposite the first sidewall, each fin has an upper portion where the first and second sidewall are substantially parallel to one another and a lower portion where the first and second sidewalls are non-parallel to one another; a first dielectric region disposed between a first fin of the plurality of fins and a second fin of the plurality of fins, the first dielectric region having a top surface substantially planar with the top surface of the first fin and the second fin; a second dielectric region disposed between the second fin and a third fin of the plurality of fins, the second dielectric region having a top surface below the top surface of the second fin and the third fin; a continuous gate structure overlying the plurality of fins, the continuous gate structure disposed on the top surface of the first dielectric region and the top surface of the second dielectric region; a first continuous conductive layer overlying source regions of the first, second and third fins and forming a single source region of a single finFET transistor that includes the first, second and third fins; and a second continuous conductive layer overlying drain regions of the first, second and third fins and forming a drain source region of the finFET transistor. Other embodiments of this aspect include corresponding computer systems, apparatus, and computer programs recorded on one or more computer storage devices, each configured to perform the actions of the methods.

Yet another general aspect described herein includes a device including: a substrate; a first isolation region over the substrate, the first isolation region having a first thickness; a second isolation region over the substrate, the second isolation region having a second thickness, the first thickness being greater than the second thickness; a first fin extending between the first isolation region and the second isolation region, a first sidewall of the first fin being in physical contact with the first isolation region, a second sidewall of the first fin being in physical contact with the second isolation region, the first sidewall of the first fin being opposite the second sidewall of the first fin, a topmost surface of the first fin being substantially level with a topmost surface of the first isolation region, the topmost surface of the first fin being above a topmost surface of the second isolation region; a second fin adjacent the second isolation region, a first sidewall of the second fin being in physical contact with the second isolation region, a topmost surface of the second fin being above the topmost surface of the second isolation region; and a continuous gate structure over the first fin and the second fin, the continuous gate structure being in physical contact with the topmost surface and the second sidewall of the first fin, and the topmost surface, the first sidewall and a second sidewall of the second fin, the second sidewall of the second fin being opposite the first sidewall of the second fin.

Yet another general aspect described herein includes a device including: a substrate; an isolation structure over the substrate, the isolation structure including a first isolation region, a second isolation region and a third isolation region, the first isolation region and the second isolation region having a first thickness, the third isolation region having a second thickness less than the first thickness; a first fin over the substrate and between the first isolation region and the second isolation region, a topmost surface of the first fin being substantially level with a topmost surface of the first isolation region and a topmost surface of the second isolation region; a second fin over the substrate and between the second isolation region and the third isolation region, a topmost surface of the second fin being substantially level with the topmost surface of the second isolation region, the topmost surface of the second fin being above a topmost surface of the third isolation region; and a continuous gate structure over the first fin and the second fin, the continuous gate structure extending along the topmost surface of the first fin, and along the topmost surface and a sidewall of the second fin.

Yet another general aspect described herein includes a device including: a substrate; an isolation structure over the substrate, the isolation structure including a first isolation region, a second isolation region and a third isolation region, the first isolation region having a first thickness, the second isolation region and the third isolation region having a second thickness less than the first thickness; a first fin between the first isolation region and the second isolation region, a topmost surface of the first fin being substantially level with a topmost surface of the first isolation region, the topmost surface of the first fin being above a topmost surface of the second isolation region; a second fin between the second isolation region and the third isolation region, a topmost surface of the second fin being above the topmost surface of the second isolation region and a topmost surface of the third isolation region; and a continuous gate structure over the first fin and the second fin, the continuous gate structure being in physical contact with the topmost surface and a sidewall of the first fin, and the topmost surface and sidewalls of the second fin.

Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a substrate;
   a first isolation region over the substrate, the first isolation region having a first thickness;
   a second isolation region over the substrate, the second isolation region having a second thickness, the first thickness being greater than the second thickness;
   a first fin extending between the first isolation region and the second isolation region, a first sidewall of the first fin being in physical contact with the first isolation region, a second sidewall of the first fin being in physical contact with the second isolation region, the first sidewall of the first fin being opposite the second sidewall of the first fin, a topmost surface of the first fin being substantially level with a topmost surface of the first isolation region, the topmost surface of the first fin being above a topmost surface of the second isolation region;
   a second fin adjacent the second isolation region, a first sidewall of the second fin being in physical contact with the second isolation region, a topmost surface of the second fin being above the topmost surface of the second isolation region; and
   a continuous gate structure over the first fin and the second fin, the continuous gate structure being in physical contact with the topmost surface and the second sidewall of the first fin, the topmost surface of the second fin, and the first sidewall and a second sidewall of the second fin at locations below the topmost surface of the second fin, the second sidewall of the second fin being opposite the first sidewall of the second fin.

2. The device of claim 1, further comprising a third fin adjacent the first isolation region, a first sidewall of the third fin being in physical contact with the first isolation region, a topmost surface of the third fin being substantially level with the topmost surface of the first isolation region.

3. The device of claim 1, further comprising a third isolation region over the substrate and adjacent the second fin, the third isolation region having a third thickness less than the first thickness, the topmost surface of the second fin being above a topmost surface of the third isolation region.

4. The device of claim 1, wherein the first sidewall and the second sidewall of the first fin are non-parallel sidewalls.

5. The device of claim 1, wherein the first sidewall and the second sidewall of the second fin are non-parallel sidewalls.

6. The device of claim 1, wherein the continuous gate structure is in physical contact with the topmost surface of the first isolation region and the topmost surface of the second isolation region.

7. The device of claim 1, wherein the substrate, the first fin and the second fin comprise a same semiconductor material.

8. A device comprising:
   a substrate;
   an isolation structure over the substrate, the isolation structure comprising a first isolation region, a second isolation region and a third isolation region, the first isolation region and the second isolation region having a first thickness, the third isolation region having a second thickness less than the first thickness;
   a first fin over the substrate and between the first isolation region and the second isolation region, a topmost surface of the first fin being substantially level with a topmost surface of the first isolation region and a topmost surface of the second isolation region;
   a second fin over the substrate and between the second isolation region and the third isolation region, a topmost surface of the second fin being substantially level with the topmost surface of the second isolation region, the topmost surface of the second fin being in direct contact with the topmost surface of the second isolation region, the topmost surface of the second fin being above a topmost surface of the third isolation region; and
   a continuous gate structure over the first fin and the second fin, the continuous gate structure extending along the topmost surface of the first fin, and along the topmost surface and a sidewall of the second fin.

9. The device of claim 8, further comprising a third fin over the substrate, the third isolation region being between the second fin and the third fin, a topmost surface of the third fin being above the topmost surface of the third isolation region.

10. The device of claim 9, wherein the isolation structure further comprises a fourth isolation region, the third fin being between the third isolation region and the fourth isolation region, the topmost surface of the third fin being substantially level with a topmost surface of the fourth isolation region.

11. The device of claim 10, wherein the fourth isolation region has the first thickness.

12. The device of claim 8, wherein the continuous gate structure is in physical contact with the topmost surface of the first isolation region, the topmost surface of the second isolation region, and the topmost surface of the third isolation region.

13. The device of claim 8, wherein the second fin extends above the third isolation region by a height that is between about ⅓ and about ¼ of the first thickness.

14. A device comprising:
    a substrate;

an isolation structure over the substrate, the isolation structure comprising a first isolation region, a second isolation region and a third isolation region, the first isolation region having a first thickness, the second isolation region and the third isolation region having a second thickness less than the first thickness;

a first fin between the first isolation region and the second isolation region, a topmost surface of the first fin being substantially level with a topmost surface of the first isolation region, the topmost surface of the first fin being above a topmost surface of the second isolation region;

a second fin between the second isolation region and the third isolation region, a topmost surface of the second fin being above the topmost surface of the second isolation region and a topmost surface of the third isolation region; and a continuous gate structure over the first fin and the second fin, the continuous gate structure being in physical contact with the topmost surface and a sidewall of the first fin, and the topmost surface and sidewalls of the second fin.

15. The device of claim 14, wherein the continuous gate structure is in physical contact with the topmost surface of the first isolation region, the topmost surface of the second isolation region, and the topmost surface of the third isolation region.

16. The device of claim 14, further comprising a third fin, the third isolation region being between the second fin and the third fin, a topmost surface of the third fin being above the topmost surface of the third isolation region.

17. The device of claim 16, wherein the isolation structure further comprises a fourth isolation region, the third fin being between the third isolation region and the fourth isolation region, the topmost surface of the third fin being substantially level with a topmost surface of the fourth isolation region.

18. The device of claim 17, wherein the fourth isolation region has the first thickness.

19. The device of claim 14, further comprising a third fin, the first isolation region being between the first fin and the third fin, a topmost surface of the third fin being substantially level with the topmost surface of the first isolation region.

20. The device of claim 14, wherein the first fin extends above the second isolation region by a height that is between about ⅓ and about ¼ of the first thickness.

* * * * *